(12) United States Patent
Muraviev et al.

(10) Patent No.: US 9,250,130 B2
(45) Date of Patent: Feb. 2, 2016

(54) QUANTUM CASCADE LASER WITH AUTONOMOUSLY ALIGNED EXTERNAL CAVITY AND RELATED METHODS

(71) Applicant: UNIVERSITY OF CENTRAL FLORIDA RESEARCH FOUNDATION, INC., Orlando, FL (US)

(72) Inventors: Andrey V. Muraviev, Orlando, FL (US); Douglas Maukonen, Oviedo, FL (US); Christopher J. Fredricksen, Orlando, FL (US); Robert E. Peale, Winter Park, FL (US)

(73) Assignee: UNIVERSITY OF CENTRAL FLORDIA RESEARCH FOUNDATION, INC., Orlando, FL (US)

( * ) Notice: Subject to any disclaimer, the term of this patent is extended or adjusted under 35 U.S.C. 154(b) by 0 days.

(21) Appl. No.: 14/483,494

(22) Filed: Sep. 11, 2014

(65) Prior Publication Data

US 2015/0070698 A1     Mar. 12, 2015

Related U.S. Application Data

(60) Provisional application No. 61/876,308, filed on Sep. 11, 2013.

(51) Int. Cl.
| | |
|---|---|
| *H01S 5/14* | (2006.01) |
| *G01J 3/28* | (2006.01) |
| *G01J 3/02* | (2006.01) |
| *H01S 3/139* | (2006.01) |
| *H01S 5/34* | (2006.01) |

(52) U.S. Cl.
CPC ............... *G01J 3/28* (2013.01); *G01J 3/0205* (2013.01); *H01S 3/1392* (2013.01); *H01S 5/14* (2013.01); *H01S 5/3402* (2013.01); *H01S 5/141* (2013.01)

(58) Field of Classification Search
CPC ................................ H01S 5/14; H01S 5/3402
See application file for complete search history.

(56) References Cited

U.S. PATENT DOCUMENTS

| | | | |
|---|---|---|---|
| 2012/0170043 A1* | 7/2012 | Rao ................... | G01N 33/0037 356/437 |
| 2015/0160126 A1* | 6/2015 | Carangelo ......... | G01N 21/3504 356/437 |

OTHER PUBLICATIONS

Tsai et al., "Active wavelength control of an external cavity quantum cascasde laser", Applied Physics B, Lasers and Optics, May 2012.*

(Continued)

*Primary Examiner* — Charlie Y Peng
(74) *Attorney, Agent, or Firm* — Allen, Dyer, Doppelt, Milbrath & Gilchrist, P.A.

(57) ABSTRACT

A quantum cascade laser (QCL) may include a QCL crystal having an emitting facet, and an active region adjacent the emitting facet, the emitting facet for providing an electromagnetic beam. The QCL may include an optical cavity comprising a mirror being external to the QCL crystal, and for redirecting the electromagnetic beam into the active region of the QCL crystal to provide optical feedback, and a driver circuit for driving the QCL crystal with a constant current. The QCL may include a controller coupled to the optical cavity and for dynamically and autonomously aligning the optical cavity based upon an error signal from the QCL crystal to maintain stable the optical feedback into the active region of the QCL crystal.

31 Claims, 5 Drawing Sheets

(56) References Cited

OTHER PUBLICATIONS

Kischkat et al., Alignment-stabilized interferennce filter-tuned external-cavity quantum cascade laser, Optics Letters, Dec. 2014.*
"Manual Instruction for Bomem DA8 FTIR Spectrometer and IR-Plan Microscope", Institute of Physics—Belgrade, Center for Solid State Physics and New Materials, 2009, pp. 1-10.
Phillips et al., "Intracavity Sensing via Compliance Voltage in an External Cavity Quantum Cascade Laser," Optics Letters, vol. 37, No. 13, Jul. 1, 2012, pp. 2664-2666.
Muraviev et al., "Quantum Cascade Laser Intracavity Absorption Spectrometer for Trace Gas Sensing," Applied Physics Letters 103, 091111, 2013, pp. 091111-1-091111-4.
Daylight Solutions, Quantum Cascade Laser Products, QCL, Sep. 5, 2014, pp. 1-2.

* cited by examiner

QUANTUM CASCADE LASER WITH AUTONOMOUSLY ALIGNED EXTERNAL CAVITY AND RELATED METHODS

RELATED APPLICATIONS

This application is based upon prior filed copending application Ser. No. 61/876,308 filed Sep. 11, 2013, the entire subject matter of which is incorporated herein by reference in its entirety.

TECHNICAL FIELD

The present disclosure relates to the field of quantum cascade lasers, and, more particularly, to external cavity quantum cascade lasers and related methods.

BACKGROUND

External cavity quantum cascade lasers (QCLs) may be used in high resolution molecular spectroscopy and molecular sensing applications. Stable optical feedback into the active gain region of the QCL semiconductor crystal is very sensitive to the precise alignment of the external cavity optics since this active gain region has dimensions comparable to the wavelength of the laser radiation, i.e. a few micrometers. The external cavity is subject to alignment noise and drift, which may degrade signal-to-noise ratio and sensitivity of the system for its intended application.

SUMMARY

Generally speaking, a QCL may comprise a QCL crystal having at least one emitting facet, and an active region adjacent the at least one emitting facet, the at least one emitting facet for providing an electromagnetic beam. The QCL may further include an optical cavity comprising at least one mirror being external to the QCL crystal, and for redirecting the electromagnetic beam into the active region of the QCL crystal to provide optical feedback. The QCL may also include a driver circuit for driving the QCL crystal with a constant current, and a controller coupled to the optical cavity and for dynamically and autonomously aligning the optical cavity based upon at least one error signal from the QCL crystal to maintain stable the optical feedback in the active region of the QCL crystal. In some embodiments, the constant current may comprise a plurality of constant current pulses.

Also, the at least one error signal may comprise a voltage waveform across the QCL crystal based upon a varying impedance of the QCL crystal. The voltage waveform may include a plurality of spikes due to mode-hops during application of the constant current to the QCL crystal, and the controller may dynamically and autonomously align the optical cavity based upon magnitudes of the plurality of spikes. In other embodiments, the controller may dynamically and autonomously align the optical cavity based upon a minimum value in the voltage waveform during application of the constant current to the QCL crystal.

Moreover, the QCL crystal may comprise a reflecting facet adjacent the active region and opposite the at least one emitting facet. The at least emitting face may have an anti-reflection coating thereon. The optical cavity may comprise a feedback mirror external to the QCL crystal, and the QCL may include at least one motor coupled to control the optical cavity to achieve feedback. The controller may be coupled to the at least one motor and may align the optical cavity by at least repositioning the feedback mirror. The controller may also dither alignment of the feedback mirror during application of the constant current to the QCL crystal.

In another embodiment, the eternal cavity may further comprise a collimating optic, and the collimating optic may be a lens or a mirror, and the controller may be coupled to the at least one motor and may align the optical cavity by at least repositioning the collimating optic. In yet another embodiment, the controller may be coupled to the at least one motor and may align the optical cavity by at least repositioning the QCL crystal. The QCL may further comprise an interferometer for receiving the output of the optical cavity, and an optical detector coupled to the interferometer.

Another aspect is directed to a spectrometer. The spectrometer may include a container having at least one vapor sample therein, and a QCL. The QCL may include a QCL crystal having at least one emitting facet, and an active region adjacent the at least one emitting facet, the at least one emitting facet for providing an electromagnetic beam, and an optical cavity comprising at least one mirror being external to the QCL crystal, and for redirecting the electromagnetic beam into the active region of the QCL crystal to provide optical feedback. The container may be positioned to allow the electromagnetic beam within the optical cavity to pass through the container, and a portion of the electromagnetic radiation may be extracted from the optical cavity for spectral analysis to determine absorption by the at least one vapor sample in the container. The QCL may include a driver circuit for driving the QCL crystal with a constant current. The spectrometer may further include a controller coupled to the optical cavity and for dynamically and autonomously aligning the optical cavity based upon at least one error signal from the QCL crystal to maintain stable the optical feedback in the active region of the QCL crystal.

Another aspect is directed to a method of operating a QCL. The QCL may include a QCL crystal having at least one emitting facet, and an active region adjacent the at least one emitting facet, the at least one emitting facet for providing an electromagnetic beam. The QCL may include an optical cavity comprising at least one mirror being external to the QCL crystal, and for redirecting the electromagnetic beam into the active region of the QCL crystal to provide optical feedback, and a driver circuit for driving the QCL crystal with a constant current. The method may include dynamically and autonomously aligning the optical cavity based upon at least one error signal from the QCL crystal to maintain stable the optical feedback in the active region of the QCL crystal.

DETAILED DESCRIPTION

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout.

A QCL includes a set of electrically-biased quantum wells formed in a semiconducting crystal having a first reflective facet, a second emitting facet, and an active region between the first reflective and second emitting facets. The second emitting facet may be for out-coupling of an electromagnetic beam from the laser cavity formed by the facets.

In some embodiments, it is advantages to form an external cavity, whereby one or both of the crystal facets are replaced as laser-cavity mirrors by external mirrors separated from the active crystal. These cavity mirrors may serve functions of wavelength selection or output coupling, but generally all have the common feature of providing optical feedback into the active region of the crystal, which is necessary for stimulated emission and lasing.

The QCL crystal is generally excited by a driver circuit that provides constant current to create the conditions for optical gain in the active crystal. The driver may provide pulses of electrical excitation, whereby the constant current is applied for durations of from 100 ns to tens of ms, or it may apply continuous current excitation. The laser driver typically adjusts the voltage applied to the QCL, in order to maintain the condition of constancy of the applied current. Such voltage adjustments are necessary, because the impedance of the QCL crystal is generally dependent on time, particularly in pulsed mode of operation, due to changes in crystal temperature or the intensity and distribution of stimulated radiation within the cavity.

The time-variable voltage applied to the QCL in order to maintain the condition of the constancy of the applied current therefore provides an indication of the conditions inside the active crystal. In particular, it has been noticed experimentally, see "Quantum cascade Laser Intracavity Absorption Spectrometer for Trace Gas Sensing," A. V. Muraviev, D. E. Maukonen, C. J. Fredricksen, Gautam Medhi, and R. E. Peale, Appl. Phys. Lett. 103, 091111 (2013), that in the case of the external cavity QCL, the voltage applied to the crystal under conditions of constant-current excitation depends on the level of optical feedback. Thus, the voltage may serve as an error signal from the active gain medium to a suitable circuit that continuously adjusts the external cavity mirrors in order to maintain stable and optimal optical feedback into the active region of the QCL.

In some embodiments, the at least one error signal may comprise a voltage waveform across the active gain quantum device based upon a varying impedance of the active gain quantum device. The observation is that when the feedback is optimized, the active crystal impedance is minimized, so that the voltage drop across the active crystal at the same constant current is also minimized. The controller of the autonomous alignment system may operate to align the optical cavity so that the magnitude of the voltage across the active crystal under conditions of constant current excitation is minimized. This suggested means is applicable whether the laser driver excitation is pulsed or continuous.

Additionally, the voltage waveform may include a plurality of spikes therein, which are due to mode-hops, during which the distribution of radiation inside the cavity is briefly perturbed. It was observed experimentally, see "Quantum cascade Laser Intracavity Absorption Spectrometer for Trace Gas Sensing," A. V. Muraviev, D. E. Maukonen, C. J. Fredricksen, Gautam Medhi, and R. E. Peale, Appl. Phys. Lett, 103, 091111 (2013), that the magnitude of these spikes is maximized when the optical feedback is optimized. Hence, the spike magnitude constitutes a second potentially useful error signal, upon which to base an autonomous cavity alignment mechanism. This means of autonomous alignment may work best for pulsed excitation of the active QCL by the laser driver, since in stable continuous operation, the mode hops may be absent.

More specifically, the optical cavity may comprise a feedback mirror for reflecting electromagnetic radiation back into the active gain quantum device. The QCL may include at least one motor coupled to the feedback mirror.

The controller may be coupled to the at least one motor and align the optical cavity by at least repositioning the feedback mirror. The controller may dither alignment of the feedback mirror during the plurality of constant current pulses or during the continuous constant current excitation.

Another aspect is directed to an intracavity laser spectrometer. The spectrometer may include a container having at least one vapor sample therein, and a QCL. The QCL may include an active QCL crystal having a first reflective facet, a second emitting facet, and an active region between the first reflective and second emitting facets. The second emitting facet is for providing an electromagnetic beam. The QCL may include an optical system external to the active QCL crystal and providing optical feedback into the active region of the active QCL crystal. A container that contains at least one vapor sample may be positioned inside the external cavity so that the beam passes through the container. The optical cavity formed by the reflecting facet and the external optical system is an active cavity with a circulating electromagnetic beam that passes repeatedly through the active region of the active QCL crystal. An outcoupling device extracts a portion of this beam for spectral analysis to observe the effect of the absorption from the at least one vapor sample on the laser spectrum. The QCL may also include a driver circuit for driving the active QCL crystal with a plurality of constant current pulses or with continuous current excitation. The spectrometer may further include a controller coupled to the optical cavity and for selectively aligning the optical cavity based upon at least one error signal from the active QCL crystal to maintain stable feedback into the active region of the active QCL crystal.

Another aspect is directed to a method of operating a QCL. The QCL may include an active gain quantum device having a first reflective facet, a second emitting facet, and an active region between the first reflective and second emitting facets, the second emitting facet for providing an electromagnetic beam. The QCL may also include an optical system external to the active QCL crystal, and wherein the optical system completes the laser cavity. The external active cavity contains a circulating electromagnetic beam that passes repeatedly through the active region of the active QCL crystal. A portion of the electromagnetic beam is emitted via an out-coupling device. A driver circuit excites the active gain quantum device with a plurality of constant current pulses or with continuous current. The method may include selectively aligning the optical cavity based upon at least one error signal from the active gain quantum device to maintain stable feedback in the active gain quantum device.

Figure 1:
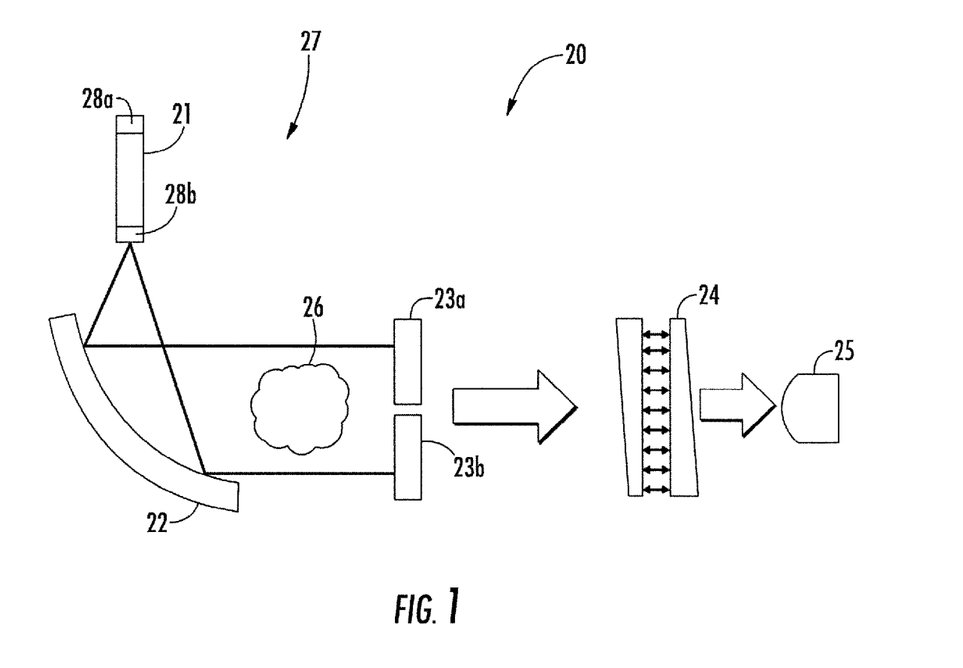
FIG. 1 is a schematic diagram of a gas sensor system based upon an external cavity QCL, according to the present disclosure.

FIG. 1 discloses an embodiment of an external cavity QCL system 20, as disclosed in "Quantum cascade Laser Intracavity Absorption Spectrometer for Trace Gas Sensing," A. V. Muraviev, D. E. Maukonen, C. J. Fredricksen, Gautam Medhi, and R. E. Peale, Appl. Phys. Lett. 103, 091111 (2013), the entire contents of which are hereby incorporated by reference in their entirety. An infrared open-cavity QCL 27 illustratively includes an active medium device 21 with high-reflecting (HR) back mirror 28a and anti-reflection (AR) coated front facet 28b, a collimating mirror 22, and plane mirrors 23a-23b with provision for output coupling. The system 20 illustratively includes a scanning Fabry-Perot interferometer 24 and detector 25 for analyzing the multi-mode laser emission spectrum with and without analyte vapors 26 in the cavity. Multiple reflections inside the active cavity, where gain compensates for cavity losses, enable approximate km effective optical path-lengths. Mode competition causes a high sensitivity of the spectrum to intracavity absorbers, which results in excellent sensitivity to trace vapors based upon their infrared signature bands. High sensitivity is achieved only when the feedback into the active crystal is optimum and stable.

Figure 2:
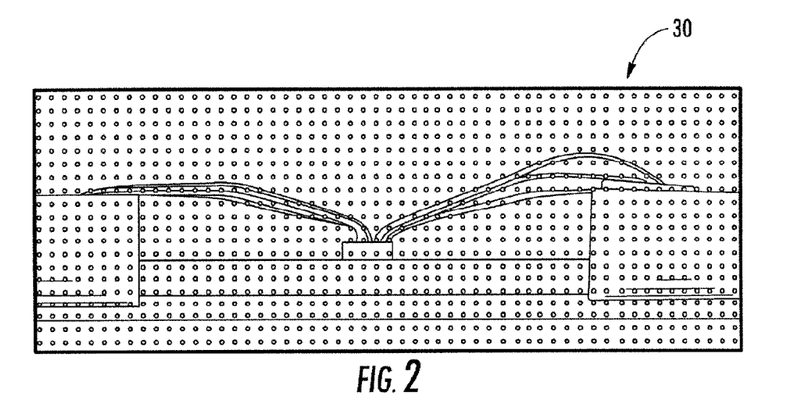
FIG. 2 is an image of a QCL crystal, which is bonded to a mount, and which is wire bonded to conduct excitation current from a suitable driver to the crystal, according to the present disclosure.

FIG. 2 is an image 30 of a QCL. The width of the crystal at center is about 1 mm, and the length into the plane of the image is about 4 mm. The active part of the crystal is a layer that is only about 10 micrometers thick, which is comparable to the wavelength of the emitted light. When the QCL is operated with an external cavity, as in FIG. 1, optimal optical feedback into this thin region is difficult to maintain in the presence of environmental disturbances, such as vibrations or temperature fluctuations.

Figure 5:
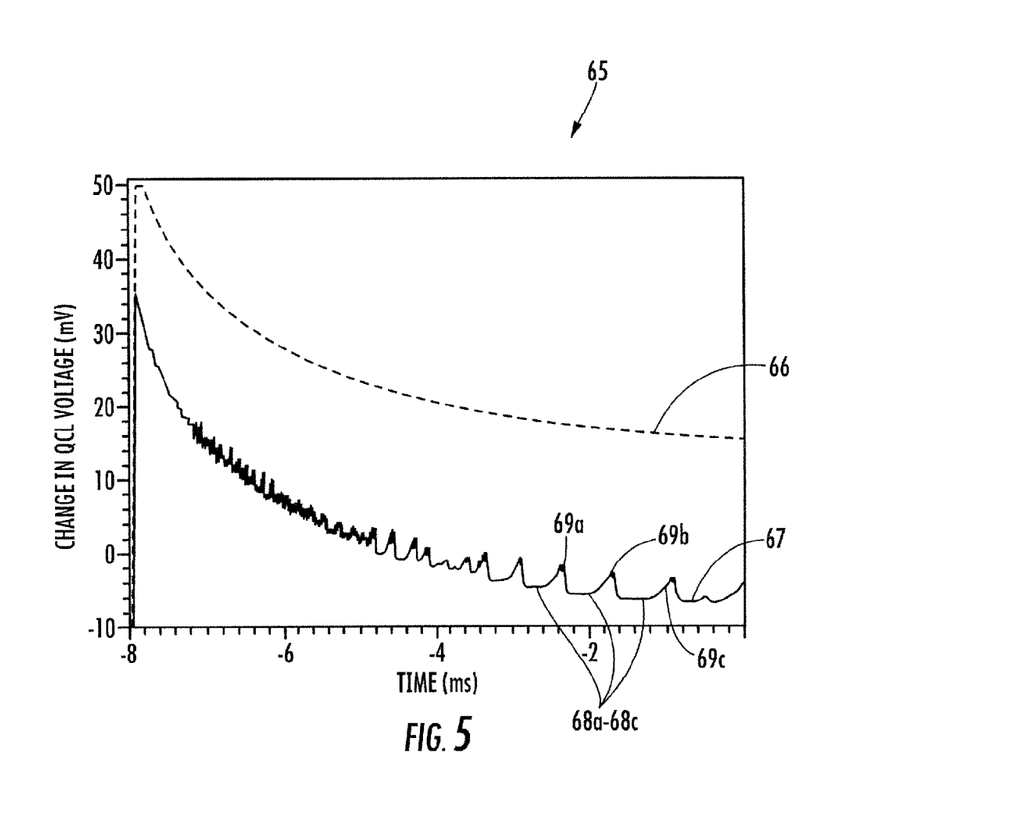
FIG. 5 is a diagram of QCL voltage for one ~10 ms pulse of constant current excitation, according to the present disclosure.

The present disclosure provides a dynamic alignment (DA) of the external QCL cavity to maintain optimum optical feedback into the laser active element. FIG. 5 shows the voltage waveforms across the QCL for a ~10 ms pulse of constant current excitation. When feedback from the external cavity mirror into the micrometer thick active stripe of the laser is optimum, the crystal impedance reaches a minimum and prominent spikes appear due to mode hops. This provides two possible error signals for use in a DA system. The minimum value of the transient during the last portion of the laser pulse (the last 1-2 ms) may be minimized, or the spike amplitude during the same time window may be maximized, in order to reach optimal alignment of the system. Applicant has found that the spikes are due to mode hops, which occur as the active crystal heats during the excitation pulse. For stable continuous excitation, the mode hops would likely not occur, or be so infrequent as to be less useful for alignment. The exponential tail of the transient voltage is an excellent indicator of alignment of the cavity mirrors independent of the observation or frequency of the mode-hop spikes.

Interpolating the QCL voltage waveform with a smooth baseline from the minimum side of the waveform, thereby eliminating the spikes, is a potentially valuable method for determining whether the optimum mirror position is being maintained (for calibration). The output laser intensity measured by a detector beyond the output coupler shows spikes in the same positions, as well as a shift of the baseline, but the spikes on the detector signal are more difficult to separate from the baseline. This is potentially due to the relaxation time of the detecting element or the settling time of its amplifier. For the specific external cavity application shown in FIG. 1, use of the QCL voltage rather than detector voltage has the advantage that the QCL voltage is not modulated by the Fabry-Perot interferometer, which is positioned between the output coupler and the detector.

To implement the alignment, the feedback mirror can be mounted on a 3-axis mirror mount with piezoelectric actuators. The "Z" axis of the piezoelectric mount gives a deflection along the optical axis, and the "X" and "Y" axes provide tip/tilt motion. (This is exactly the same mount as used on the scanning Fabry-Perot in FIG. 3.) In order to avoid interference of the dynamic alignment algorithm with actual analyte detection (for the intracavity laser absorption spectrometer application shown in FIGS. 1 and 3), the alignment can be checked and corrected during select laser pulses, such as one pulse out of every 1000, during which the piezoelectric motors will intentionally dither the alignment along orthogonal axes while optimizing the error signal.

Figure 3:
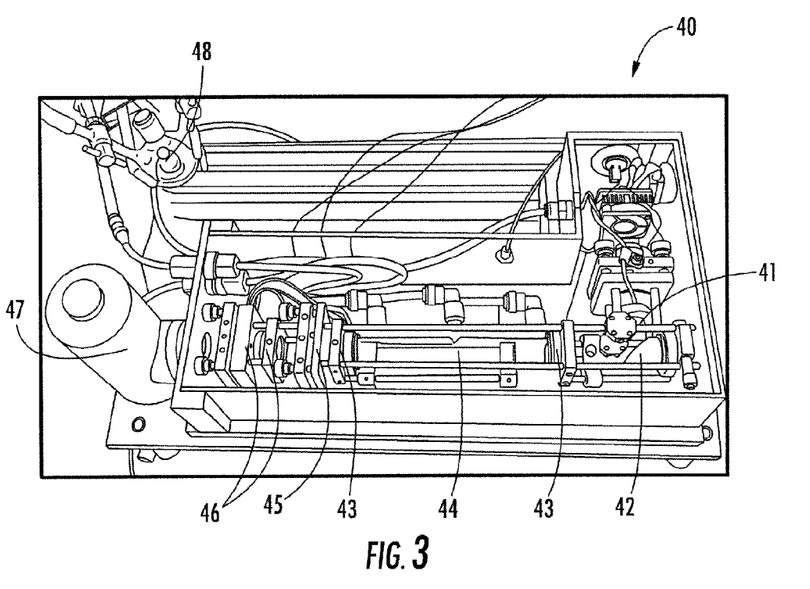
FIG. 3 is an image of an implementation of the gas sensor system of FIG. 1.

Instead of moving the feedback mirror of the external cavity to adjust the alignment, the collimating optic, which may be a mirror as in FIGS. 1 and 3 or a lens, or the QCL crystal itself may be moved with suitable piezoelectric actuators. Or, a combination of these components may be moved.

If the baseline QCL voltage with a sample in the cavity (for the FIGS. 1 and 3) is not dramatically altered, then it may be possible to judge alignment quality from fits of the QCL voltage baseline during the gas-sensing measurements. Additional pulses used only for alignment purposes would not be necessary in that case. In FIG. 3, a photographic image 40 shows the external cavity QCL sensor system of FIG. 1 illustratively including a QCL crystal 41, a parabolic mirror 42, mode-limiting apertures 43, a vapor cell 44, an output coupler 45, a scanning Fabry-Perot 46, a detector 47, and a source of analyte vapor 48.

Figure 4:
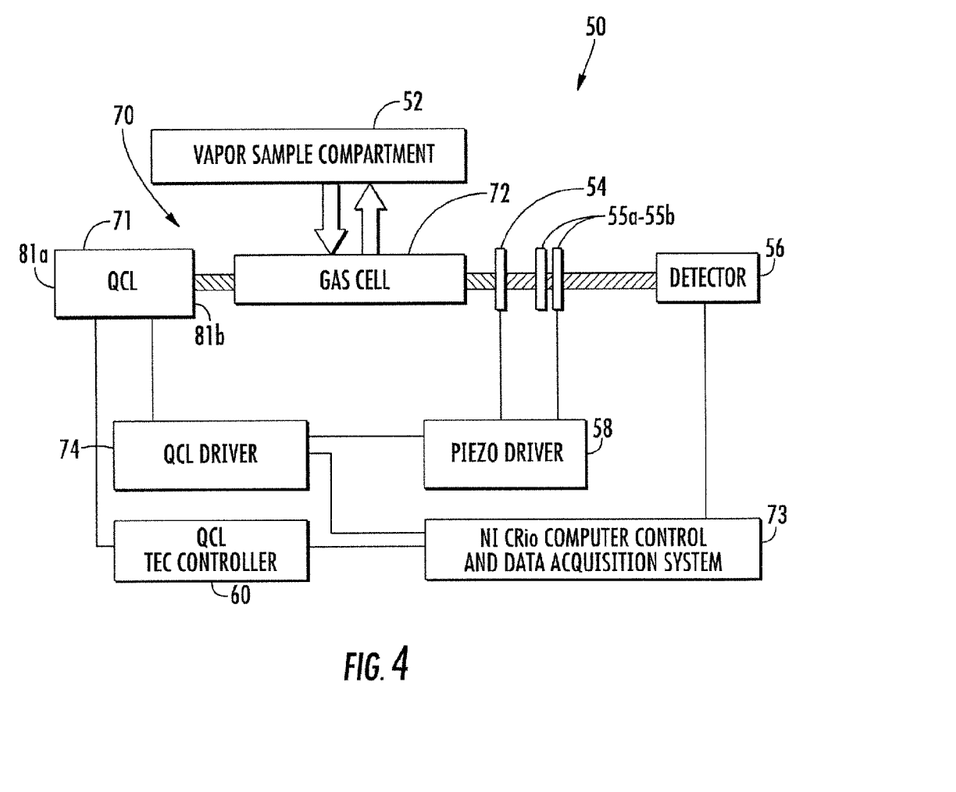
FIG. 4 is a schematic block diagram of control electronics for the gas sensor system of FIG. 3.

For the system of FIGS. 3 and 4, the QCL voltage has been sampled at 1 MHz, with 20 consecutive points being averaged. Such averaging reduces the 9000 points collected in 9 ms to 450 points. Scanning the Fabry-Perot over its entire range in 450 steps gives a square 450 by 450 array. Using an amplifier with a higher bandwidth allows sampling of the QCL voltage at 1 MHz or greater, giving the potential for measuring fast changes over the course of each pulse. That would be useful for alignment if it is possible to get useful information from dithering of the mirror during a single pulse.

The adjustment of the feedback mirror position for dynamic alignment during the pulse must change the development of the laser emission spectrum during the pulse. This gives a potentially third source of an error signal for alignment, in addition to the QCL voltage level and the magnitude of the mode-hop voltage spikes. A limiting factor in the system of FIG. 3 is that the control voltages fed to the piezoelectric motors come from the CRIO analog output module (as available from National Instruments Corporation of Austin, Tex.) (FIG. 4), which has a maximum update rate of 25 kHz. There are faster DACs available, though, so it is not out of reach to make measurements every microsecond and update the control voltages to the piezoelectric motors on a similar time scale.

The present disclosure relates to methods and systems for active dynamic alignment of an external cavity QCL system. Such a system includes a QCL-active crystal with a high-reflecting back mirror and an anti-reflection coated front facet, the laser-active crystal producing a beam, an optic to collect and collimate the beam emerging from the laser-active crystal, and a feedback mirror to back reflect the beam and complete the optical cavity of the laser system. An error signal is derived from the voltage across the QCL crystal for constant current excitation, the voltage depending on the crystal impedance. And/or an error signal may be obtained from the magnitude of spikes due to mode hops on the voltage applied to the crystal during constant current excitation. And/or, an error signal may be obtained from suitably imaged spatial mode patterns. And/or, an error signal may be obtained from the laser emission spectrum, and/or the spectral mode pattern in the spectrum. Any or all of these potential error signals may be used to achieve automatic adjustment of laser mount, collimating optic, and/or cavity mirror, in order to minimize the error signal and thereby optimize the external cavity alignment to achieve optimal feedback in the active gain region of the QCL crystal.

Figure 6:
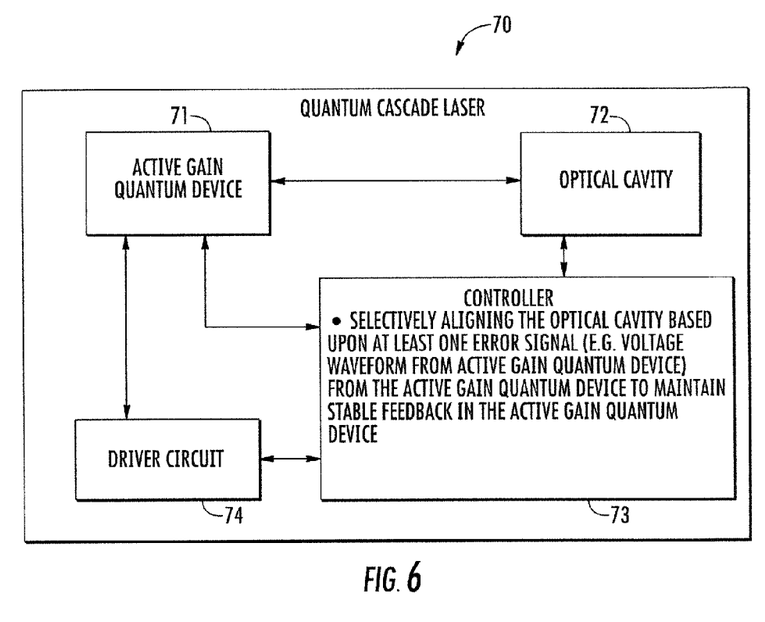
FIG. 6 is a schematic block diagram of a QCL, according to the present disclosure.

Referring now additionally to FIG. 6, a QCL 70 according to the present disclosure is now described. The QCL 70 illustratively includes a QCL crystal (i.e. an active gain QCL crystal) 71 having a first reflective facet (FIG. 4: 81a), a second emitting facet (FIG. 4: 81b), and an active region between the first reflective and second emitting facets. Other embodiments may include double sided systems with a plurality of emitting facets.

The second emitting facet 28b is for providing an electromagnetic beam. The QCL 70 illustratively includes a feedback mirror 54 that completes the optical cavity 72. The feedback mirror 54 is external to the QCL crystal 71. The feedback mirror 54 may also function as an output coupler for emitting a portion of the beam circulating in the external cavity and through the QCL crystal 71. A QCL driver circuit 74 excites the QCL crystal 71 with a plurality of constant current pulses, or with continuous constant current.

Also, the QCL 70 illustratively includes a QCL thermoelectric controller (FIG. 4: 60) coupled to the QCL crystal 71. The QCL 70 illustratively includes a controller 73 coupled to the optical cavity 72 and for selectively aligning the optical cavity based upon at least one error signal from the active crystal 71 to maintain stable feedback in the QCL crystal.

Referring briefly and additionally to FIG. 5, a diagram 65 illustrates a voltage waveform across the QCL crystal 71. Curve 66 illustrates such a waveform with improper alignment and poor optical feedback into the active region of the QCL crystal 71. Curve 67 illustrates such a waveform with optimum alignment and optical feedback in the active region of the QCL crystal 71. In some embodiments, the at least one error signal may comprise a voltage waveform across the QCL crystal 71 based upon a varying impedance of the QCL crystal. Additionally, the voltage waveform may include a plurality of spikes 68a-68c due to mode-hops during a constant current excitation, and the controller 73 may selectively align the cavity feedback mirror 54 based upon the magnitude of spikes 69a-69c in the plurality of mode-hops. The controller 73 may selectively align the cavity feedback mirror 54 based upon a minimum value in the voltage waveform during a constant current pulse. In other embodiments, the error signal could comprise the spatial mode pattern of the electromagnetic radiation in the optical cavity, and/or the spectrum of the electromagnetic radiation in the optical cavity.

Referring briefly and additionally to FIG. 4, the gas cell 72 is not a necessary component of the current invention. The optical cavity may comprise a feedback mirror 54 for reflecting electromagnetic radiation back into the QCL crystal 71. The QCL 70 may include at least one motor 58 coupled to the feedback mirror 54.

The controller 73 may be coupled to the at least one motor 58 and align the optical cavity by at least repositioning the feedback mirror 54. The controller 73 may dither alignment of the feedback mirror 54 during the plurality of constant current pulses. In other embodiments, the motor 58 may be coupled to the QCL crystal 71 or a collimating mirror to adjust the optical cavity.

In other embodiments, the feedback mirror 54 may be replaced with a diffraction grating, which reflects a narrow range of wavelengths back into the QCL crystal 71, and also achieves the output coupling. The diffraction grating is used for tunable wavelength selection. In these embodiments, the diffraction grating would be dynamically and autonomously aligned based upon the error signal comprising the spectrum of the electromagnetic radiation in the optical cavity. Also, the QCL 70 may further comprise an interferometer 55a-55b (e.g. a Fabry-Perot interferometer) for receiving the output of the external cavity QCL 70, and an optical detector 56 that collects light transmitted by the interferometer.

Referring again to FIG. 4, another aspect is directed to a spectrometer 50. The spectrometer 50 may include a container 72 having at least one vapor sample therein, and internal to the cavity of the external cavity QCL 70. The external cavity QCL 70 may include a QCL crystal 71 having a first reflective facet 81a, a second emitting facet 81b, and an active region between the first reflective and second emitting facets. The second emitting facet 81b is for providing an electromagnetic beam that circulates within the external cavity formed by the first reflective facet and the feedback mirror 54. The external cavity QCL 70 may include a gas cell 72 within the external cavity QCL 70 and being coupled to a vapor sample compartment 52 to permit and control the flow of the at least one vapor analyte sample. The external cavity QCL 70 may also include a driver circuit 74 for exciting optical gain in the QCL crystal 71 with a plurality of constant current pulses, or with continuous constant current. The spectrometer 50 may further include a piezo driver 58 which is directed by a controller 73, which is coupled to the external cavity's feedback mirror 54 and for dynamically and autonomously aligning the optical cavity based upon at least one error signal from the QCL crystal 71 to maintain stable feedback into the active region of the QCL crystal 71.

Another aspect is directed to a method of operating an external cavity QCL 70. The external cavity QCL 70 may include a QCL crystal 71 having a first reflective facet, a second emitting facet, and an active region between the first reflective and second emitting facets, the second emitting facet for providing an electromagnetic beam. The external-cavity QCL 70 may also include gas cell 72 being inside the external cavity 70, and a driver circuit 74 for driving the QCL crystal with a plurality of constant-current pulses or with continuous constant current. The method may include dynamically and autonomously aligning the external optical cavity 70 based upon at least one error signal from the QCL crystal 71 to maintain stable feedback in the QCL crystal.

In the following, the disclosed embodiments of the QCL may be applied to the file of planetary science, for example. The need to detect trace vapors in planetary science is compelling. Trace pollutants skew atmospheric chemistry on Earth by controlling reaction rates. Trace vapors are markers for potential life on apparently sterile solar system objects, such as Mars. In particular, there is need for local sensors to replace column or limb averaging over many kilometers. Local vapor sensors provide opportunity to seek life or resources at localized sources, such as vents or plumes. The sensor shown schematically in FIG. 1 and photographically in FIG. 3 is a sensor for localized trace gases with demonstrated ppb sensitivity. The subject invention of dynamic self-alignment can compensate for vibrations and thermal deformation in remote harsh environments, such as would be encountered in planetary exploration.

The sensor depicted in FIGS. 1 and 3 can detect localized trace gases with demonstrated ppb sensitivity, as disclosed in "Quantum cascade laser intracavity absorption spectrometer for trace gas sensing," A. V. Muraviev, D. E. Maukonen, C. J. Fredricksen, Gautam Medhi, and R. E. Peale, Appl. Phys, Lett. 103, 091111 (2013).

Many modifications and other embodiments of the present disclosure will come to the mind of one skilled in the art having the benefit of the teachings presented in the foregoing descriptions and the associated drawings. Therefore, it is understood that the present disclosure is not to be limited to That which is claimed is:

1. A quantum cascade laser (QCL) comprising:
a QCL crystal having at least one emitting facet, and an active region adjacent said at least one emitting facet, said at least one emitting facet for providing an electromagnetic beam;
an optical cavity comprising at least one mirror being external to said QCL crystal, and for redirecting the electromagnetic beam into the active region of said QCL crystal to provide optical feedback;
a driver circuit for driving said QCL crystal with a constant current; and
a controller coupled to said optical cavity and for dynamically and autonomously aligning said optical cavity based upon at least one error signal from said QCL crystal to maintain stable the optical feedback in said active region of said QCL crystal.

2. The QCL of claim 1 wherein the constant current comprises a plurality of constant current pulses.

3. The QCL of claim 1 wherein the at least one error signal comprises a voltage waveform across said QCL crystal based upon a varying impedance of said QCL crystal.

4. The QCL of claim 3 wherein the voltage waveform includes a plurality of spikes due to mode-hops during application of the constant current to said QCL crystal; and
wherein said controller dynamically and autonomously aligns said optical cavity based upon magnitudes of the plurality of spikes.

5. The QCL of claim 3 wherein said controller dynamically and autonomously aligns said optical cavity based upon a minimum value in the voltage waveform during application of the constant current to said QCL crystal.

6. The QCL of claim 1 wherein said QCL crystal comprises a reflecting facet adjacent said active region and opposite said at least one emitting facet; wherein said at least emitting face has an anti-reflection coating thereon; wherein said optical cavity comprises a feedback mirror external to said QCL crystal; and further comprising at least one motor coupled to control said optical cavity to achieve feedback.

7. The QCL of claim 6 wherein said controller is coupled to said at least one motor and aligns said optical cavity by at least repositioning said feedback mirror.

8. The QCL of claim 6 wherein said controller dithers alignment of said feedback mirror during application of the constant current to said QCL crystal.

9. The QCL of claim 1 further comprising at least one motor coupled to control said optical cavity to achieve feedback; wherein said eternal cavity further comprises a collimating optic; and wherein said controller is coupled to said at least one motor and aligns said optical cavity by at least repositioning said collimating optic.

10. The QCL of claim 1 further comprising at least one motor coupled to control said optical cavity to achieve feedback; and wherein said controller is coupled to said at least one motor and aligns said optical cavity by at least repositioning said QCL crystal.

11. The QCL of claim 1 further comprising:
an interferometer for receiving the output of said optical cavity; and
an optical detector coupled to said interferometer.

12. A spectrometer comprising:
a container having at least one vapor sample therein;
a quantum cascade laser (QCL) comprising
a QCL crystal having at least one emitting facet, and an active region adjacent said at least one emitting facet, said at least one emitting facet for providing an electromagnetic beam,
an optical cavity comprising at least one mirror being external to said QCL crystal, and for redirecting the electromagnetic beam into the active region of said QCL crystal to provide optical feedback,
said container being positioned to allow the electromagnetic beam within said optical cavity to pass through said container,
a portion of the electromagnetic radiation to be extracted from said optical cavity for spectral analysis to determine absorption by the at least one vapor sample in said container, and
a driver circuit for driving said QCL crystal with a constant current; and
a controller coupled to said optical cavity and for dynamically and autonomously aligning said optical cavity based upon at least one error signal from said QCL crystal to maintain stable the optical feedback in said active region of said QCL crystal.

13. The spectrometer of claim 12 wherein the constant current comprises a plurality of constant current pulses.

14. The spectrometer of claim 12 wherein the at least one error signal comprises a voltage waveform across said QCL crystal based upon a varying impedance of said QCL crystal.

15. The spectrometer of claim 14 wherein the voltage waveform includes a plurality of spikes due to mode-hops during application of the constant current to said QCL crystal; and wherein said controller dynamically and autonomously aligns said optical cavity based upon magnitudes of the plurality of spikes.

16. The spectrometer of claim 14 wherein said controller dynamically and autonomously aligns said optical cavity based upon a minimum value in the voltage waveform during application of the constant current to said QCL crystal.

17. The spectrometer of claim 12 wherein said QCL crystal comprises a reflecting facet adjacent said active region and opposite said at least one emitting facet; wherein said at least emitting face has an anti-reflection coating thereon; wherein said optical cavity comprises a feedback mirror external to said QCL crystal; and further comprising at least one motor coupled to control said optical cavity to achieve feedback.

18. The spectrometer of claim 17 wherein said controller is coupled to said at least one motor and aligns said optical cavity by at least repositioning said feedback mirror.

19. The spectrometer of claim 17 wherein said controller dithers alignment of said feedback mirror during application of the constant current to said QCL crystal.

20. The spectrometer of claim 12 wherein said QCL comprises at least one motor coupled to control said optical cavity to achieve feedback; wherein said eternal cavity further comprises a collimating optic; and wherein said controller is coupled to said at least one motor and aligns said optical cavity by at least repositioning said collimating optic.

21. The spectrometer of claim 12 wherein said QCL comprises at least one motor coupled to control said optical cavity to achieve feedback; and wherein said controller is coupled to said at least one motor and aligns said optical cavity by at least repositioning said QCL crystal.

22. A method of operating a quantum cascade laser (QCL) comprising a QCL crystal having at least one emitting facet, and an active region adjacent the at least one emitting facet, the at least one emitting facet for providing an electromagnetic beam, an optical cavity comprising at least one mirror being external to the QCL crystal, and for redirecting the electromagnetic beam into the active region of said QCL crystal to provide optical feedback, and a driver circuit for driving the QCL crystal with a constant current, the method comprising:

dynamically and autonomously aligning the optical cavity based upon at least one error signal from the QCL crystal to maintain stable the optical feedback in the active region of the QCL crystal.

23. The method of claim 22 wherein the constant current comprises a plurality of constant current pulses.

24. The method of claim 22 wherein the at least one error signal comprises a voltage waveform across the QCL crystal based upon a varying impedance of the QCL crystal.

25. The method of claim 24 wherein the voltage waveform includes a plurality of spikes due to mode-hops during application of the constant current to the QCL crystal; and further comprising dynamically and autonomously aligning of the optical cavity is based upon magnitudes of the plurality of spikes.

26. The method of claim 24 further comprising dynamically and autonomously aligning the optical cavity based upon a minimum value in the voltage waveform during application of the constant current to the QCL crystal.

27. The method of claim 22 wherein the QCL crystal comprises a reflecting facet adjacent the active region and opposite the at least one emitting facet; wherein the at least emitting face has an anti-reflection coating thereon; wherein the optical cavity comprises a feedback mirror external to the QCL crystal; and further comprising using at least one motor coupled to control the optical cavity to achieve feedback.

28. The method of claim 27 wherein the dynamically and autonomously aligning of the optical cavity comprises repositioning the feedback mirror with the at least one motor.

29. The method of claim 27 further comprising dithering alignment of the feedback mirror during application of the constant current to said QCL crystal.

30. The method of claim 22 further comprising using at least one motor coupled to control the optical cavity to achieve feedback; wherein the eternal cavity further comprises a collimating optic; and further comprising using the at least one motor to align the optical cavity by at least repositioning the collimating optic.

31. The method of claim 22 further comprising:
using at least one motor coupled to control the optical cavity to achieve feedback; and
using the at least one motor to align the optical cavity by at least repositioning the QCL crystal.

* * * * *